US012801007B2

(12) United States Patent
Kuroki et al.

(10) Patent No.: US 12,801,007 B2
(45) Date of Patent: Nov. 17, 2026

(54) PHASE SHIFT MASK BLANK, PHASE SHIFT MASK, AND METHOD FOR MANUFACTURING PHASE SHIFT MASK

(71) Applicant: TEKSCEND PHOTOMASK CORP., Tokyo (JP)

(72) Inventors: Kyoko Kuroki, Tokyo (JP); Kazuaki Matsui, Tokyo (JP); Yosuke Kojima, Tokyo (JP)

(73) Assignee: TEKSCEND PHOTOMASK CORP., Tokyo (JP)

( * ) Notice: Subject to any disclaimer, the term of this patent is extended or adjusted under 35 U.S.C. 154(b) by 580 days.

(21) Appl. No.: 18/024,958

(22) PCT Filed: Sep. 7, 2021

(86) PCT No.: PCT/JP2021/032896

§ 371 (c)(1),
(2) Date: Mar. 6, 2023

(87) PCT Pub. No.: WO2022/054810

PCT Pub. Date: Mar. 17, 2022

(65) Prior Publication Data

US 2023/0333461 A1 Oct. 19, 2023

(30) Foreign Application Priority Data

Sep. 8, 2020 (JP) ................................. 2020-150758

(51) Int. Cl.
*G03F 1/26* (2012.01)
*G03F 1/48* (2012.01)
*G03F 1/80* (2012.01)

(52) U.S. Cl.
CPC .................. *G03F 1/26* (2013.01); *G03F 1/48* (2013.01); *G03F 1/80* (2013.01)

(58) Field of Classification Search
CPC ..... G03F 1/26; G03F 1/48; G03F 1/80; G03F 1/32
See application file for complete search history.

(56) References Cited

U.S. PATENT DOCUMENTS 8,663,875 B2 3/2014 Okubo et al.
9,164,374 B2 10/2015 Igarashi et al.
(Continued)

FOREIGN PATENT DOCUMENTS

JP H10-003162 A 1/1998
JP 2002-162727 A 6/2002
(Continued)

OTHER PUBLICATIONS

International Preliminary Report on Patentability mailed Mar. 23, 2023, for International Application No. PCT/JP2021/032896, 6 pages.
(Continued)

*Primary Examiner* — Stewart A Fraser
(74) *Attorney, Agent, or Firm* — Squire Patton Boggs (US) LLP

(57) ABSTRACT

There are provided a phase shift mask blank capable of sufficiently suppressing the generation of a haze on a mask, a phase shift mask with few haze defects, and a method for manufacturing the phase shift mask. A phase shift mask blank (10) according to this embodiment is a phase shift mask blank used for producing a phase shift mask to which an exposure light with a wavelength of 200 nm or less is applied, and the phase shift mask blank (10) includes: a substrate (11); and a phase shift film (14) formed on the substrate (11), in which the phase shift film (14) includes a phase layer (12) capable of adjusting each of the phase and the transmittance by a predetermined amount with respect to a transmitting exposure light and a protective layer (13) formed on the phase layer (12) and preventing gas perme-
(Continued)

ation into the phase layer (12), when the film thickness of the phase layer (12) is defined as d1 and the film thickness of the protective layer (13) is defined as d2, the film thickness (d1) of the phase layer (12) is larger than the film thickness (d2) of the protective layer (13) and the film thickness (d2) of the protective layer (13) is 15 nm or less.

5 Claims, 2 Drawing Sheets

(56) References Cited

U.S. PATENT DOCUMENTS

| | | | | |
|---|---|---|---|---|
| 2002/0061452 | A1 | 5/2002 | Nozawa et al. | |
| 2003/0228528 | A1 | 12/2003 | Mitsul et al. | |
| 2005/0250018 | A1 | 11/2005 | Ushida et al. | |
| 2006/0134534 | A1* | 6/2006 | Dieu | G03F 1/48 134/1 |
| 2007/0076833 | A1 | 4/2007 | Becker et al. | |
| 2008/0044740 | A1* | 2/2008 | Lin | G03F 1/48 204/192.1 |
| 2010/0124711 | A1 | 5/2010 | Tanabe | |
| 2010/0167185 | A1* | 7/2010 | Suzuki | G03F 1/32 430/5 |
| 2012/0034434 | A1 | 2/2012 | Nozawa et al. | |
| 2012/0034552 | A1 | 2/2012 | Okubo et al. | |
| 2015/0268552 | A1* | 9/2015 | Nam | G03F 1/26 430/5 |
| 2018/0224737 | A1 | 8/2018 | Inazuki et al. | |
| 2018/0252995 | A1* | 9/2018 | Matsumoto | G03F 1/32 |
| 2022/0043335 | A1* | 2/2022 | Ohkubo | G03F 1/54 |
| 2022/0121105 | A1* | 4/2022 | Van Lare | G03F 7/20 |

FOREIGN PATENT DOCUMENTS

| | | | |
|---|---|---|---|
| JP | 2003-315980 | A | 11/2003 |
| JP | 2010-122409 | A | 6/2010 |
| JP | 4579728 | B2 | 11/2010 |
| JP | 2011-065113 | A | 3/2011 |
| JP | 2015-096973 | A | 5/2015 |
| JP | 2015-184453 | A | 10/2015 |
| JP | 2017-227824 | A | 12/2017 |
| JP | 2018-173621 | A | 11/2018 |
| JP | 2020-134577 | A | 8/2020 |
| KR | 2011-0126687 | A | 11/2011 |
| SG | 11201907839 | R | 10/2018 |
| WO | WO 2004/059384 | A1 | 7/2004 |
| WO | WO 2018/181891 | A1 | 10/2018 |

OTHER PUBLICATIONS

Extended European Search Report dated Sep. 20, 2024, for European Patent Application No. 21866769.9, 11 pages.

International Search Report mailed Nov. 2, 2021, for International Application No. PCT/JP2021/032896, with English translation, 5 pages.

* cited by examiner

PHASE SHIFT MASK BLANK, PHASE SHIFT MASK, AND METHOD FOR MANUFACTURING PHASE SHIFT MASK

CROSS-REFERENCE

This application is a National Stage filing under 35 U.S.C. § 371 of International Patent Application No. PCT/JP2021/032896, filed Sep. 7, 2021, which claims the benefit of and priority to Japanese Patent Application No. 2020-150758, filed Sep. 8, 2020, the contents of all of which are hereby incorporated by reference in their entireties for all purposes.

TECHNICAL FIELD

The present invention relates to a phase shift mask blank, a phase shift mask, and a method for manufacturing a phase shift mask used in the manufacture of semiconductor devices and the like.

BACKGROUND ART

In recent years, in the processing of semiconductors, the miniaturization of circuit patterns has become necessary particularly due to the high integration of large-scale integrated circuits, and a demand for a technology for miniaturizing wiring patterns and contact hole patterns constituting circuits has increased. Therefore, the wavelength of an exposure light source used in the manufacture of semiconductor devices and the like has become shorter from a KrF excimer laser (wavelength of 248 nm) to an ArF excimer laser (wavelength of 193 nm).

As a mask with improved wafer transfer characteristics, a phase shift mask is mentioned, for example. The phase shift mask can adjust both a phase difference between an ArF excimer laser light transmitting through a transparent substrate and an ArF excimer laser light transmitting through both the transparent substrate and a phase shift film (hereinafter simply referred to as "phase difference") and a ratio of the amount of the ArF excimer laser light transmitting through both the transparent substrate and the phase shift film to the amount of the ArF excimer laser light transmitting through the transparent substrate (hereinafter simply referred to as "transmittance") such that the phase difference is 180° and the transmittance is 6%.

For example, when a phase shift mask having the phase difference of 180° is manufactured, a method is known which includes setting the film thickness of the phase shift film such that the phase difference is around 177°, and then dry etching the phase shift film with a fluorine-based gas and, simultaneously therewith, processing a transparent substrate by a thickness of about 3 nm, thereby finally adjusting the phase difference to around 180°.

In a phase shift mask to which an exposure light with a wavelength of 200 nm or less is applied, a foreign substance referred to as "haze" is gradually generated, grown, and actualized on the mask by exposure, so that the mask sometimes becomes unusable. In particular, when the phase shift film is a film containing silicon, transition metal, and light elements, such as oxygen and nitrogen, the foreign matter is sometimes generated on the surface of the phase shift film.

Technologies for suppressing the haze are those described in PTLS 1, 2, for example.

However, in the technologies described in PTLS 1, 2, the effect of suppressing the haze as described above is sometimes insufficient.

CITATION LIST

Patent Literatures

PTL 1: JP 2018-173621 A
PTL 2: JP 4579728 B

SUMMARY OF INVENTION

Technical Problem

The present invention has been made under the above-described circumstances. It is an object of the present invention to provide a phase shift mask blank capable of sufficiently suppressing the generation of a haze on the surface of a phase shift film, a phase shift mask with few haze defects, and a method for manufacturing the phase shift mask.

Solution to Problem

The present invention has been made to solve the above-described problems. A phase shift mask blank according to one aspect of the present invention is a phase shift mask blank used for producing a phase shift mask to which an exposure light with a wavelength of 200 nm or less is applied, and the phase shift mask blank includes: a transparent substrate; and a phase shift film formed on the transparent substrate; in which the phase shift film includes: a phase difference and transmittance adjustment layer capable of adjusting each of the phase and the transmittance by a predetermined amount with respect to a transmitting exposure light; and a protective layer against gas permeation formed on the phase difference and transmittance adjustment layer and preventing gas permeation into the phase difference and transmittance adjustment layer, the phase difference and transmittance adjustment layer is located on the transparent substrate side, and, when the film thickness of the phase difference and transmittance adjustment layer is defined as d1 and the film thickness of the protective layer against gas permeation is defined as d2, d1 is larger than d2, and d2 is 15 nm or less.

A phase shift mask according to one aspect of the present invention is a phase shift mask to which an exposure light with a wavelength of 200 nm or less is applied and which includes a circuit pattern, and the phase shift mask includes: a transparent substrate; and a phase shift film formed on the transparent substrate; in which the phase shift film includes: a phase difference and transmittance adjustment layer capable of adjusting each of the phase and the transmittance by a predetermined amount with respect to a transmitting exposure light; and a protective layer against gas permeation formed on the phase difference and transmittance adjustment layer and preventing gas permeation into the phase difference and transmittance adjustment layer, the phase difference and transmittance adjustment layer is located on the transparent substrate side, and, when the film thickness of the phase difference and transmittance adjustment layer is defined as d1 and the film thickness of the protective layer against gas permeation is defined as d2, d1 is larger than d2, and d2 is 15 nm or less.

A method for manufacturing a phase shift mask according to one aspect of the present invention is a method for manufacturing a phase shift mask using the above-described phase shift mask blank and includes: forming a light shielding film on the phase shift film; forming a resist pattern on the light shielding film formed on the phase shift film; after forming the resist pattern; forming a pattern on the light shielding film by oxygen-containing chlorine-based etching (Cl/O base); after forming the pattern on the light shielding film, forming a pattern on the phase shift film by fluorine-based etching (F base); after forming the pattern on the phase shift film, removing the resist pattern; and, after removing the resist pattern, removing the light shielding film by the oxygen-containing chlorine-based etching (Cl/O base) from the phase shift film.

Advantageous Effects of Invention

The use of the phase shift mask blank according to one aspect of the present invention can sufficiently suppress the generation of the haze on the mask.

DESCRIPTION OF EMBODIMENTS

The present inventors of this application have configured a phase shift mask blank or a phase shift mask as follows considering that the generation of a haze in the mask blank or the mask can be reduced unless all the following three factors are satisfied: a constituent material of a phase adjustment film (a phase difference and transmittance adjustment layer described later) constituting the phase shift mask blank or the phase shift mask, oxidizing gases, such as water and oxygen, and the exposure energy. More specifically, the phase shift mask blank, the phase shift mask, and a method for manufacturing the same according to this embodiment are based on such a technical idea that the generation of the haze can be reduced by providing a protective layer against gas (so-called gas barrier layer) on the phase adjustment film for preventing the contact of the oxidizing gases with the constituent material of the phase adjustment film.

Hereinafter, an aspect for implementing the present invention is described with reference to the drawings. Note that the cross-sectional schematic views do not accurately reflect the actual dimensional ratio or number of patterns, and omit the digging-down amount of a transparent substrate and the amount of damage to films.

As a suitable embodiment of the phase shift mask blank of the present invention, an aspect described below is mentioned.

(Entire Configuration of Phase Shift Mask Blank)

Figure 1:
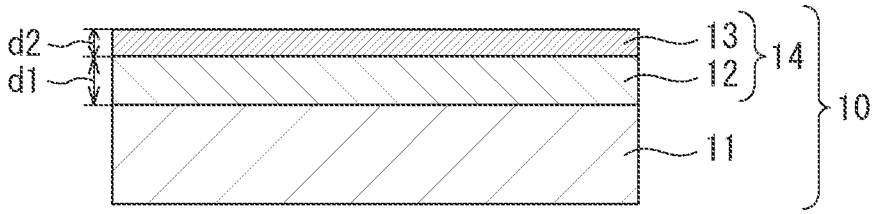
FIG. 1 is a cross-sectional schematic view illustrating the configuration of a phase shift mask blank according to an embodiment of the present invention.

FIG. 1 is a cross-sectional schematic view illustrating the configuration of the phase shift mask blank according to the embodiment of the present invention. A phase shift mask blank 10 illustrated in FIG. 1 is a phase shift mask blank used for producing a phase shift mask to which an exposure light with a wavelength of 200 nm or less is applied and includes a substrate transparent to an exposure wavelength (hereinafter also simply referred to as "substrate") 11 and a phase shift film 14 formed on the substrate 11. Further, the phase shift film 14 includes at least a phase difference and transmittance adjustment layer (hereinafter also simply referred to as "phase layer") 12 capable of adjusting each of the phase and the transmittance by a predetermined amount with respect to a transmitting exposure light and a protective layer against gas permeation (hereafter also simply referred to as "protective layer") 13 formed on the phase difference and transmittance adjustment layer 12 and preventing the gas permeation into the phase difference and transmittance adjustment layer 12, and the phase layer 12 is located on the substrate 11 side. When the film thickness of the phase layer 12 is defined as d1 and the film thickness of the protective layer 13 is defined as d2, d1 is larger than d2, and d2 is 15 nm or less.

Hereinafter, the layers constituting the phase shift mask blank 10 according to the embodiment of the present invention are described in detail.

(Substrate)

There is no particular limitation on the substrate 11, and, as the substrate 11, quartz glass, $CaF_2$, aluminosilicate glass, or the like is commonly used, for example.

(Phase Shift Film) The phase shift film 14 includes the phase layer 12 and the protective layer 13 in this order, and is formed on the substrate 11 with or without through the other films.

The phase shift film 14 is a film having resistance to oxygen-containing chlorine-based etching (Cl/O base) and can be etched by fluorine-based etching (F base), for example.

The value of the transmittance of the phase shift film 14 is within the range of 3% or more and 80% or less with respect to the transmittance of the substrate 11, for example. The optimum transmittance can be appropriately selected according to a desired wafer pattern. The value of the phase difference of the phase shift film 14 is within the range of 160° or more and 220° or less and more preferably within the range of 175° or more and 190° or less, for example. More specifically, the phase shift film 14 may have transmittivity to an exposure light within the range of 3% or more and 80% or less and a phase difference within the range of 160° or more and 220° or less. When the transmittivity to an exposure light of the phase shift film 14 is less than 3%, good exposure performance cannot be sometimes obtained. When the phase difference is within the range of 160° or more and 220° or less, the required exposure performance can be easily maintained.

<Phase Layer>

The phase layer 12 is formed on the substrate 11 with or without through the other films, and is a layer capable of adjusting each of the phase and the transmittance by a predetermined amount with respect to a transmitting exposure light. Herein, the "adjusting the phase" means inverting the phase, for example. The "transmittance" means the transmittance to an exposure light.

The phase layer 12 is, for example, a monolayer film containing silicon and containing at least one selected from transition metal, nitrogen, oxygen, and carbon, a multi-layer film thereof, or a gradient film, in which the transmittance and the phase difference with respect to the exposure wavelength are adjusted by appropriately selecting the composition and the film thickness.

The phase layer 12 preferably contains silicon within the range of 20 at % or more and 60 at % or less, preferably contains transition metal within the range of 0 at % or more and 20 at % or less, preferably contains nitrogen within the range of 30 at % or more and 80 at % or less, preferably contains oxygen within the range of 0 at % or more and 30 at % or less, and preferably contains carbon within the range of 0 at % or more and 10 at % or less in terms of the element ratio of the entire phase layer 12. A more preferable content range of each element in the phase layer 12 is as follows: Silicon is within the range of 30 at % or more and 50 at % or less, transition metal is within the range of 0 at % or more and at % or less, nitrogen is within the range of 40 at % or more and 70 at % or less, oxygen is within the range of 0 at % or more and 20 at % or less, and carbon is within the range of 0 at % or more and 5 at % or less in terms of the element ratio of the entire phase layer 12. When the content of each element in the phase layer 12 is within the numerical ranges above, not only the transmittance of the phase layer 12 but the phase difference can be easily controlled.

The phase layer 12 may be one containing at least one of oxides, carbides, and nitrides of metal silicide. In that case, metals constituting the metal silicide may be the transition metal described above.

The transition metal contained in the phase layer 12 is preferably at least one selected from molybdenum, titanium, vanadium, cobalt, nickel, zirconium, niobium, and hafnium, and is more preferably molybdenum. When the transition metal contained in the phase layer 12 is at least one selected from molybdenum, titanium, vanadium, cobalt, nickel, zirconium, niobium, and hafnium, the phase layer 12 can be easily processed and, in the case of molybdenum, the workability of etching and the like of the phase layer 12 is enhanced.

When the film thickness of the phase layer 12 is defined as d1 and the film thickness of the protective layer 13 is defined as d2, the film thickness d1 of the phase layer 12 is larger than the film thickness d2 of the protective layer 13, and the film thickness d2 of the protective layer 13 is 15 nm or less. When the film thickness d2 of the protective layer 13 is larger than 15 nm, there is a possibility that the optical characteristics and the correction characteristics are affected.

The film thickness d1 of the phase layer 12 may be larger than 15 nm. When the film thickness d1 of the phase layer 12 is larger than 15 nm, the adjustment of each of the phase and the transmittance is facilitated.

The total film thickness of the film thickness of the phase layer 12 and the film thickness of the protective layer 13 is preferably 50 nm or more and more preferably 70 nm or more. When the total film thickness of the film thickness of the phase layer 12 and the film thickness of the protective layer 13 is within the numerical range above, the functions of the phase shift film 14 can be easily set to desired values.

<Protective Layer>

The protective layer 13 is formed on the phase layer 12 with or without through the other films, and is a layer for preventing or suppressing gas permeation (particularly, permeation of oxidizing gases, such as water and oxygen) into the phase layer 12, i.e., a gas barrier layer. In the case of this embodiment, the permeation of gas, which is considered to be one of the factors of causing the haze, into the phase layer 12 can be prevented or suppressed. Therefore, even when the mask is used over a long period of time (for example, when the dose amount on the mask exceeds 100 $kJ/cm^2$), the generation of the haze on the surface of the phase shift mask can be prevented or suppressed.

The gas (atmospheric gas), the permeation of which is prevented or suppressed by the protective layer 13, is an oxidizing gas, and specifically an oxygen-containing molecule and more specifically a water molecule.

The protective layer 13 is preferably a layer which is resistant to the oxygen-containing chlorine-based (Cl/O base) gas etching, can be etched with a fluorine-based gas (F base), and can be repaired by an electron beam (EB) repair method.

The protective layer 13 is preferably a monolayer film containing one or more compounds selected from tantalum metal, a tantalum compound, tungsten metal, a tungsten compound, tellurium metal, and a tellurium compound, a mixed film of these compounds, or a multi-layer film. The composition is not particularly limited insofar as it is a layer having a barrier function. The tantalum metal, the tungsten metal, and the tellurium metal mentioned above mean simple substances of the metals.

The protective layer 13 containing the tantalum compound is a monolayer film containing tantalum and one or more elements selected from oxygen, nitrogen, and carbon, a multi-layer film thereof, or a gradient film.

The protective layer 13 containing the tantalum compound preferably contains tantalum within the range of at % or more and 90 at % or less, oxygen within the range of 0 at % or more and 90 at % or less, nitrogen within the range of 0 at % or more and 70 at % or less, and carbon within the range of 0 at % or more and 20 at % or less in terms of the element ratio of the entire protective layer 13. A more preferable content range of each element in the protective layer 13 containing the tantalum compound is as follows: Tantalum is within the range of 20 at % or more and 80 at % or less, oxygen is 0 at % or more and 80 at % or less, nitrogen is 0 at % or more and 60 at % or less, and carbon is 0 at % or more and 10 at % or less in terms of the element ratio of the entire protective layer 13. When the content of each element in the protective layer 13 containing the tantalum compound is within the numerical ranges above, the barrier property against the gas permeation into the phase layer 12 of the protective layer 13 is enhanced.

The protective layer 13 containing the tungsten compound is a monolayer film containing tungsten and one or more elements selected from oxygen, nitrogen, and carbon, a multi-layer film thereof, or a gradient film.

The protective layer 13 containing the tungsten compound preferably contains tungsten within the range of at % or more and 70 at % or less, preferably contains oxygen within the range of 30 at % or more and 90 at % or less, preferably contains nitrogen within the range of 0 at % or more and 20 at % or less, and preferably contains carbon within the range of 0 at % or more and 20 at % or less in terms of the element ratio of the entire protective layer 13. A more preferable content range of each element in the protective layer 13 containing the tungsten compound is as follows: Tungsten is within the range of 20 at % or more and 60 at % or less, oxygen is within the range of 50 at % or more and 80 at % or less, nitrogen is within the range of 0 at % or more and 10 at % or less, and carbon is within the range of 0 at % or more and 10 at % or less in terms of the element ratio of the entire protective layer 13. When the content of each element in the protective layer 13 containing the tungsten compound is within the numerical ranges above, the barrier property against the gas permeation into the phase layer 12 of the protective layer 13 is enhanced.

The protective layer 13 containing the tellurium compound is a monolayer film containing tellurium and one or more elements selected from oxygen, nitrogen, and carbon, a multi-layer film thereof, or a gradient film.

The protective layer 13 containing the tellurium compound preferably contains tellurium within the range of 20 at % or more and 70 at % or less, preferably contains oxygen within the range of 30 at % or more and 90 at % or less, preferably contains nitrogen within the range of 0 at % or more and 20 at % or less, and preferably contains carbon within the range of 0 at % or more and 20 at % or less in terms of the element ratio of the entire protective layer 13. A more preferable content range of each element in the protective layer 13 containing the tellurium compound is as follows: Tellurium is within the range of 30 at % or more and 60 at % or less, oxygen is within the range of 50 at % or more and 80 at % or less, nitrogen is within the range of 0 at % or more and 10 at % or less, and carbon is within the range of 0 at % or more and 10 at % or less in terms of the element ratio of the entire protective layer 13. When the content of each element in the protective layer 13 containing the tellurium compound is within the numerical ranges above, the barrier property against the gas permeation into the phase layer 12 of the protective layer 13 is enhanced.

As described above, when the protective layer 13 is a monolayer film containing one or more compounds selected from the tantalum metal, the tantalum compound, the tungsten metal, the tungsten compound, the tellurium metal, and the tellurium compound, or a mixed film of these compounds, or a multi-layer film, the gas permeation into the phase layer 12 can be effectively prevented.

The film thickness d2 of the protective layer 13 is nm or less as described above. When the film thickness d2 of the protective layer 13 is within the numerical ranges above, the barrier property against the gas permeation into the phase layer 12 can be maintained while the optical characteristics and the repair characteristics are maintained.

(Entire Configuration of Phase Shift Mask)

Hereinafter, the configuration of a phase shift mask 100 according to the embodiment of the present invention is described.

Figure 2:
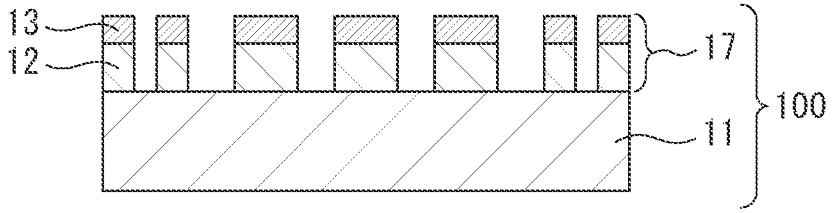
FIG. 2 is a cross-sectional schematic view illustrating the configuration of a phase shift mask according to the embodiment of the present invention.

FIG. 2 is a cross-sectional schematic view illustrating the configuration of the phase shift mask according to the embodiment of the present invention. The phase shift mask 100 illustrated in FIG. 2 is a phase shift mask to which an exposure light with a wavelength of 200 nm or less is applied and which includes a circuit pattern (i.e., a patterned phase shift mask), and includes the substrate 11 transparent to an exposure wavelength and the phase shift film 14 formed on the substrate 11. The phase shift film 14 includes at least the phase layer 12 capable of adjusting each of the phase and the transmittance by a predetermined amount with respect to a transmitting exposure light and the protective layer 13 formed on the phase layer 12 and preventing the gas permeation into the phase layer 12, and the phase layer 12 is located on the substrate 11 side. When the film thickness of the phase layer 12 is defined as d1 and the film thickness of the protective layer 13 is defined as d2, d1 is larger than d2, and d2 is 15 nm or less.

The phase shift mask 100 has a phase shift film pattern 17 formed by removing parts of the phase shift film 14 and exposing the surface of the substrate 11.

The composition and the like of the layers constituting the phase shift mask 100 according to the embodiment of the present invention are the same as the composition and the like of the layers constituting the phase shift mask blank 10 according to the embodiment of the present invention described above, and therefore detailed descriptions of the composition and the like of the layers are omitted.

(Method for Manufacturing Phase Shift Mask)

A method for manufacturing the phase shift mask 100 using the phase shift mask blank 10 according to this embodiment includes: forming a light shielding film 15 on the phase shift film 14; forming a resist pattern 16 on the light shielding film 15 formed on the phase shift film 14; after forming the resist pattern 16, forming a pattern on the light shielding film 15 by the oxygen-containing chlorine-based etching (Cl/O base); after forming the pattern on the light shielding film 15, forming a pattern on the phase shift film 14 by the fluorine-based etching (F base); after forming the pattern on the phase shift film 14, removing the resist pattern 16; and, after removing the resist pattern 16, removing the light shielding film 15 by the oxygen-containing chlorine-based etching (Cl/O base) from the phase shift film 14.

Herein, the light shielding film 15 according to the embodiment of the present invention is described.

<Light Shielding Film>

The light shielding film 15 is a layer formed on the phase shift mask blank 10 (protective layer 13) according to the embodiment of the present invention described above.

The light shielding film 15 is a monolayer film containing a chromium simple substance or a chromium compound, a multi-layer film thereof, or a gradient film, for example. More specifically, the light shielding film containing the chromium compound is a monolayer film containing chromium and one or more elements selected from nitrogen and oxygen, a multi-layer film thereof, or a gradient film.

The light shielding film 15 containing the chromium compound preferably contains chromium within the range of at % or more and 100 at % or less, preferably contains oxygen within the range of 0 at % or more and 50 at % or less, preferably contains nitrogen within the range of 0 at % or more and 50 at % or less, and preferably contains carbon within the range of 0 at % or more and 10 at % or less in terms of the element ratio of the entire light shielding film 15. A more preferable content range of each element in the light shielding film 15 containing the chromium compound is as follows: Chromium is within the range of 50 at % or more and 100 at % or less, oxygen is within the range of 0 at % or more and 40 at % or less, nitrogen is within the range of 0 at % or more and 40 at % or less, and carbon is within the range of 0 at % or more and 5 at % or less in terms of the element ratio of the entire light shielding film 15. When the content of each element in the light shielding film 15 containing the chromium compound is within the numerical ranges above, the light shielding property of the light shielding film is enhanced.

The film thickness of the light shielding film 15 is preferably within the range of 35 nm or more and 80 nm or less and particularly preferably within the range of 40 nm or more and 75 nm or less, for example.

The light shielding film 15 can be formed by a known method. As a method for most easily obtaining a film having excellent uniformity, a sputtering film formation method is preferably mentioned, but it is not necessary to limit the method to the sputtering film formation method in this embodiment.

A target and a sputtering gas are selected according to the film composition. For example, as a method for forming a film containing chromium, a method can be mentioned which uses a target containing chromium and performs reactive sputtering in only an inert gas, such as an argon gas, only a reactive gas, such as oxygen, or a mixed gas of an inert gas and a reactive gas. The flow rate of the sputtering gas may be adjusted according to the film characteristics and may be kept constant during film formation or may be changed according to the target composition when it is desired to change the oxygen amount or the nitrogen amount in the thickness direction of the film. A power applied to the target, the distance between the target and the substrate, and the pressure inside a film formation chamber may be adjusted.

Hereinafter, the steps of the method for manufacturing the phase shift mask 100 according to the embodiment of the present invention are described in detail.

Figure 3A:
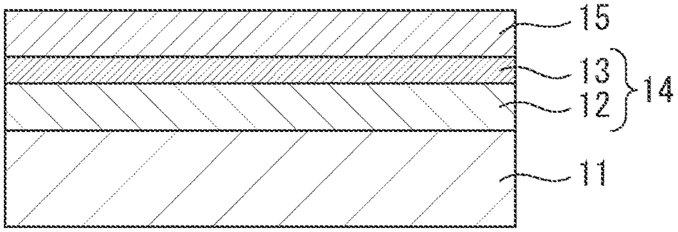
FIGS. 3A to 3F are cross-sectional schematic views illustrating steps of manufacturing the phase shift mask using the phase shift mask blank according to the embodiment of the present invention.
Figure 3B:
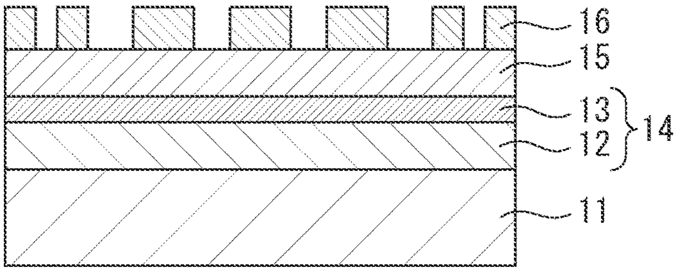
Figure 3C:
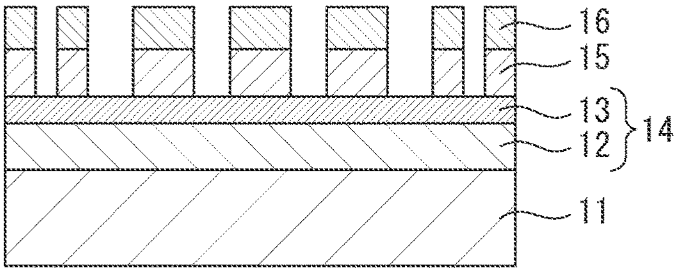
Figure 3D:
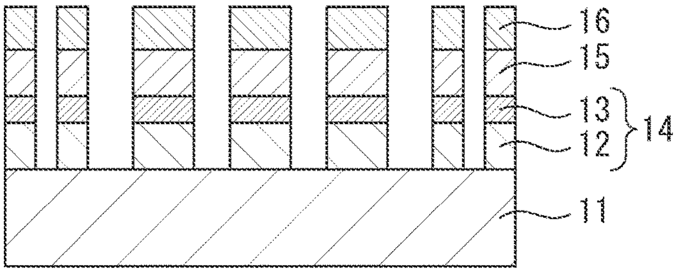
Figure 3E:
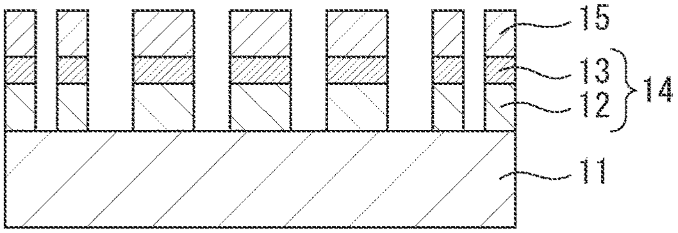
Figure 3F:
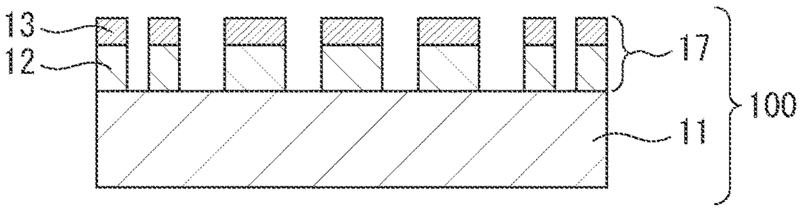

FIGS. 3A to 3F are cross-sectional schematic views illustrating the steps of manufacturing the phase shift mask 100 using the phase shift mask blank 10 illustrated in FIG. 1. FIG. 3A illustrates the step of forming the light shielding film 15 on the phase shift film 14. FIG. 3B illustrates the step of forming the resist pattern 16 by applying a resist film onto the light shielding film 15, performing writing, and then performing development treatment. FIG. 3C illustrates the step of patterning the light shielding film 15 according to the resist pattern 16 by the oxygen-containing chlorine-based dry etching (Cl/O base). FIG. 3D illustrates the step of forming the phase shift film pattern 17 by patterning the phase shift film 14 by the fluorine-based etching (F base) according to the pattern of the light shielding film 15. FIG. 3E illustrates the step of peeling and removing the resist pattern 16, and then performing cleaning. FIG. 3F illustrates the step of removing the light shielding film 15 by the oxygen-containing chlorine-based etching (Cl/O base) from the phase shift film 14 on which the phase shift film pattern 17 is formed. Thus, the phase shift mask 100 according to this embodiment is manufactured.

The phase shift mask 100 according to this embodiment is a phase shift mask to which an exposure light with a wavelength of 200 nm or less is applied and includes the substrate 11 and the phase shift film 14 formed on the substrate 11 with or without through the other films. The phase shift film 14 includes the phase layer 12 capable of adjusting each of the phase and the transmittance by a predetermined amount with respect to a transmitting exposure light and the protective layer 13 formed on the phase layer 12 and preventing the gas permeation into the phase layer 12, and the phase layer 12 is located on the substrate 11 side. The phase shift mask 100 also includes the phase shift film pattern 17 formed by removing parts of the phase shift film 14 such that parts of the substrate 11 are exposed. Then, when the film thickness of the phase layer 12 is defined as d1 and the film thickness of the protective layer 13 is defined as d2, the film thickness d1 of the phase layer 12 is larger than the film thickness d2 of the protective layer 13, and the film thickness d2 of the protective layer 13 is 15 nm or less.

In the step of FIG. 3B, as a material of the resist film, both a positive type resist and a negative type resist are usable. It is preferable to use a chemically amplified resist for electron beam writing capable of forming highly accurate patterns. The film thickness of the resist film is within the range of 50 nm or more and 250 nm or less, for example. In particular, the production of a phase shift mask requiring the formation of fine patterns requires a reduction in thickness of the resist film such that the aspect ratio of the resist pattern 16 does not increase in order to prevent pattern collapse, and thus a film thickness of 200 nm or less is preferable. On the other hand, the lower limit of the film thickness of the resist film is determined by comprehensively considering conditions, such as the etching resistance of a resist material to be used, and is preferably 60 nm or more. When a chemically amplified resist film for electron beam writing is used as the resist, the energy density of the electron beam in writing is within the range of 35 $\mu C/cm^2$ to 100 $\mu C/cm^2$. After the writing, the heat treatment and the development treatment are performed, thereby obtaining the resist pattern 16.

In the step of FIG. 3E, the removal of the resist pattern 16 may be wet stripping using a chemical liquid or may be dry stripping using dry etching.

In the step of FIG. 3C, the conditions of the oxygen-containing chlorine-based dry etching (Cl/O base) for patterning the light shielding film 15 containing the chromium simple substance or the chromium compound may be known conditions used for removing chromium compound films. In addition to the chlorine gas and the oxygen gas, an inert gas, such as a nitrogen gas or a helium gas, may be mixed as necessary. The lower-layer phase shift film 14 is resistant to the oxygen-containing chlorine-based dry etching (Cl/O base), and therefore remains without being removed or patterned in this step.

In the step of FIG. 3D, the conditions of the fluorine-based dry etching (F base) for patterning the phase shift film 14 may be known conditions used in dry etching silicon compound films, tantalum compound films, molybdenum compound films, or the like. As the fluorine-based gas, $CF_4$, $C_2F_6$, and $SF_6$ are commonly used and an activated gas, such as oxygen, or an inert gas, such as a nitrogen gas or a helium gas, may be mixed as necessary. In the case of FIG. 3D, the upper-layer light shielding film 15 or resist pattern 16 is resistant to the fluorine-based dry etching (F base), and therefore remains without being removed or patterned in this step. In FIG. 3D, it is common to simultaneously etch the substrate 11 by about 1 nm to 3 nm to prevent remaining of the phase shift film 14 and to finely adjust the phase difference.

In the step of FIG. 3F, the conditions of the oxygen-containing chlorine-based dry etching (Cl/O base) for removing the light shielding film 15 may be known conditions used for removing chromium compound films. In addition to the chlorine gas and the oxygen gas, an inert gas, such as a nitrogen gas or a helium gas, may be mixed as necessary. Both the lower-layer phase shift film 14 and substrate 11 are resistant to the oxygen-containing chlorine-based dry etching (Cl/O base), and therefore remain without being removed or patterned in this step.

EXAMPLES

Hereinafter, the embodiment of the present invention is more specifically described with reference to Examples, but the present invention is not limited to Examples below.

Example 1

A phase layer containing silicon, molybdenum, oxygen, and nitrogen was formed with a thickness of 65 nm using a DC sputtering device using two targets on a quartz substrate. Molybdenum and silicon were used as the targets, and argon, oxygen, and nitrogen were used as a sputtering gas. When the composition of the phase layer was analyzed by ESCA, the composition was Si:Mo:O:N=30:5:20:45 (at % ratio).

On the phase layer, a protective layer containing tantalum and oxygen was formed with a thickness of 8 nm using a DC sputtering device. Tantalum was used as the target, and argon and oxygen were used as a sputtering gas. When the composition of the protective layer was analyzed by ESCA, the composition was Ta:O=30:70 (at % ratio).

A phase shift film containing the phase layer and the protective layer thus formed had exposure light transmittance of 6% and a phase difference of 180°.

Next, a light shielding film containing chromium, oxygen, and nitrogen was formed with a thickness of 50 nm using a DC sputtering device on the protective layer. Chromium was used as the target, and argon, oxygen, and nitrogen were used as a sputtering gas. When the composition of the light shielding film was analyzed by ESCA, the composition was Cr:O:N=55:35:10 (at % ratio).

Next, a negative type chemically amplified electron beam resist was spin-coated on the light shielding film with a film thickness of 200 nm, a pattern was written by an electron beam with a dose amount of 35 μC/$cm^2$, heat treatment was performed at 110° C. for 10 minutes, and development was performed for 90 seconds by paddle development, thereby forming a resist pattern.

Next, the light shielding film was patterned using a dry etching device. Chlorine, oxygen, and helium were used as an etching gas, the gas pressure was set to 5 mTorr, the ICP power was set to 400 W, and the bias power was set to 40 W. The over etching was performed by 100%.

Next, the phase shift film containing the protective layer and the phase layer was patterned using a dry etching device. $CF_4$ and oxygen were used as an etching gas, and the gas pressure was set to 5 mTorr, the ICP power was set to 400 W, and the bias power was set to 40 W. The dry etching was stopped when the quartz substrate was etched by an average of 3 nm.

Next, the resist pattern was stripped and cleaned by sulfuric acid-hydrogen peroxide mixture cleaning.

Next, the light shielding film was removed using a dry etching device. Chlorine, oxygen, and helium were used as an etching gas, and the gas pressure was set to mTorr, the ICP power was set to 500 W, and the bias power was set to 10 W. The over etching was performed by 200%. At this time, no damage occurred in the lower-layer phase shift film and quartz substrate.

Thus, a phase shift mask according to Example 1 was obtained.

Next, when the phase shift mask was measured for the dose amount at which the haze was generated by accelerated exposure, the dose amount was 135 kJ/$cm^2$.

The "dose amount at which the haze was generated by accelerated exposure" above means that, when the value is larger, the haze is more difficult to be generated. When the dose amount is 70 kJ/$cm^2$ or more, there is no problem in using the phase shift mask. When the dose amount is 100 kJ/$cm^2$ or more, it can be said that the phase shift mask is extremely difficult to generate the haze.

It was confirmed from the measurement results above that the phase shift mask of Example 1 can reduce the generation of the haze because the dose amount is 135 kJ/$cm^2$.

Example 2

A phase layer containing silicon, molybdenum, oxygen, and nitrogen was formed with a thickness of 67 nm using a DC sputtering device using two targets on a quartz substrate. Molybdenum and silicon were used as the targets, and argon, oxygen, and nitrogen were used as a sputtering gas. When the composition of the phase layer was analyzed by ESCA, the composition was Si:Mo:O:N=35:5:15:45 (at % ratio).

On the phase layer, a protective layer containing tungsten and oxygen was formed with a thickness of 5 nm using a DC sputtering device. Tungsten was used as the target, and argon and oxygen were used as a sputtering gas. When the composition of the protective layer was analyzed by ESCA, the composition was W:O=25:75 (at % ratio).

A phase shift film containing the phase layer and the protective layer thus formed had exposure light transmittance of 6% and a phase difference of 180°.

Next, a light shielding film containing chromium, oxygen, and nitrogen was formed with a thickness of 50 nm using a DC sputtering device on the protective layer. Chromium was used as the target, and argon, oxygen, and nitrogen were used as a sputtering gas. When the composition of the light shielding film was analyzed by ESCA, the composition was Cr:O:N=55:35:10 (at % ratio).

Next, a negative type chemically amplified electron beam resist was spin-coated on the light shielding film with a film thickness of 200 nm, a pattern was written by an electron beam with a dose amount of 35 μC/$cm^2$, heat treatment was performed at 110° C. for 10 minutes, and development was performed for 90 seconds by paddle development, thereby forming a resist pattern.

Next, the light shielding film was patterned using a dry etching device. Chlorine, oxygen, and helium were used as an etching gas, the gas pressure was set to 5 mTorr, the ICP power was set to 400 W, and the bias power was set to 40 W. The over etching was performed by 100%.

Next, the phase shift film containing the protective layer and the phase layer was patterned using a dry etching device. $CF_4$ and oxygen were used as an etching gas, and the gas pressure was set to 5 mTorr, the ICP power was set to 400 W, and the bias power was set to 40 W. The dry etching was stopped when the quartz substrate was etched by an average of 3 nm.

Next, the resist pattern was stripped and cleaned by sulfuric acid-hydrogen peroxide mixture cleaning.

Next, the light shielding film was removed using a dry etching device. Chlorine, oxygen, and helium were used as an etching gas, and the gas pressure was set to mTorr, the ICP power was set to 500 W, and the bias power was set to 10 W. The over etching was performed by 200%. At this time, no damage occurred in the lower-layer phase shift film and quartz substrate.

Thus, a phase shift mask according to Example 2 was obtained.

Next, when the phase shift mask was measured for the dose amount at which the haze was generated by accelerated exposure, the dose amount was 92 kJ/$cm^2$.

It was confirmed from the results above that the phase shift mask of Example 2 can reduce the generation of the haze because the dose amount is 92 kJ/$cm^2$.

Example 3

A phase layer containing silicon, molybdenum, oxygen, and nitrogen was formed with a thickness of 67 nm using a DC sputtering device using two targets on a quartz substrate. Molybdenum and silicon were used as the targets, and argon, oxygen, and nitrogen were used as a sputtering gas. When the composition of the phase layer was analyzed by ESCA, the composition was Si:Mo:O:N=40:8:7:45 (at % ratio).

On the phase layer, a protective layer containing tellurium and oxygen was formed with a thickness of 3 nm using a DC sputtering device. Tellurium was used as the target, and argon and oxygen were used as a sputtering gas. When the composition of the protective layer was analyzed by ESCA, the composition was Te:O=35:65 (at % ratio).

A phase shift film containing the phase layer and the protective layer thus formed had exposure light transmittance of 6% and a phase difference of 180°.

Next, a light shielding film containing chromium, oxygen, and nitrogen was formed with a thickness of 50 nm using a DC sputtering device on the protective layer. Chromium was used as the target, and argon, oxygen, and nitrogen were used as a sputtering gas. When the composition of the light shielding film was analyzed by ESCA, the composition was Cr:O:N=55:35:10 (at % ratio).

Next, a negative type chemically amplified electron beam resist was spin-coated on the light shielding film with a film thickness of 200 nm, a pattern was written by an electron beam with a dose amount of 35 μC/$cm^2$, heat treatment was performed at 110° C. for 10 minutes, and development was performed for 90 seconds by paddle development, thereby forming a resist pattern.

Next, the light shielding film was patterned using a dry etching device. Chlorine, oxygen, and helium were used as an etching gas, the gas pressure was set to 5 mTorr, the ICP power was set to 400 W, and the bias power was set to 40 W. The over etching was performed by 100%.

Next, the phase shift film containing the protective layer and the phase layer was patterned using a dry etching device. $CF_4$ and oxygen were used as an etching gas, and the gas pressure was set to 5 mTorr, the ICP power was set to 400 W, and the bias power was set to 40 W. The dry etching was stopped when the quartz substrate was etched by an average of 3 nm.

Next, the resist pattern was stripped and cleaned by sulfuric acid-hydrogen peroxide mixture cleaning.

Next, the light shielding film was removed using a dry etching device. Chlorine, oxygen, and helium were used as an etching gas, and the gas pressure was set to 10 mTorr, the ICP power was set to 500 W, and the bias power was set to 10 W. The over etching was performed by 200%. At this time, no damage occurred in the lower-layer phase shift film and quartz substrate.

Thus, a phase shift mask according to Example 3 was obtained.

Next, when the phase shift mask was measured for the dose amount at which the haze was generated by accelerated exposure, the dose amount was 87 kJ/$cm^2$.

It was confirmed from the results above that the phase shift mask of Example 3 can reduce the generation of the haze because the dose amount is 87 kJ/$cm^2$.

Example 4

A phase layer containing silicon, molybdenum, oxygen, and nitrogen was formed with a thickness of 70 nm using a DC sputtering device using two targets on a quartz substrate. Molybdenum and silicon were used as the targets, and argon, oxygen, and nitrogen were used as a sputtering gas. When the composition of the phase layer was analyzed by ESCA, the composition was Si:Mo:O:N=35:5:15:45 (at % ratio).

On the phase layer, a protective layer containing tantalum, oxygen, and nitrogen was formed with a thickness of 2 nm using a DC sputtering device. Tantalum was used as the target, and argon, oxygen, and nitrogen were used as a sputtering gas. When the composition of the protective layer was analyzed by ESCA, the composition was Ta:O:N=65:5:30 (at % ratio).

A phase shift film containing the phase layer and the protective layer thus formed had exposure light transmittance of 6% and a phase difference of 180°.

Next, a light shielding film containing chromium, oxygen, and nitrogen was formed with a thickness of 50 nm using a DC sputtering device on the protective layer. Chromium was used as the target, and argon, oxygen, and nitrogen were used as a sputtering gas. When the composition of the light shielding film was analyzed by ESCA, the composition was Cr:O:N=55:35:10 (at % ratio).

Next, a negative type chemically amplified electron beam resist was spin-coated on the light shielding film with a film thickness of 200 nm, a pattern was written by an electron beam with a dose amount of 35 μC/$cm^2$, heat treatment was performed at 110° C. for 10 minutes, and development was performed for 90 seconds by paddle development, thereby forming a resist pattern.

Next, the light shielding film was patterned using a dry etching device. Chlorine, oxygen, and helium were used as an etching gas, the gas pressure was set to 5 mTorr, the ICP power was set to 400 W, and the bias power was set to 40 W. The over etching was performed by 100%.

Next, the phase shift film containing the protective layer and the phase layer was patterned using a dry etching device. $CF_4$ and oxygen were used as an etching gas, and the gas pressure was set to 5 mTorr, the ICP power was set to 400 W, and the bias power was set to 40 W. The dry etching was stopped when the quartz substrate was etched by an average of 3 nm.

Next, the resist pattern was stripped and cleaned by sulfuric acid-hydrogen peroxide mixture cleaning.

Next, the light shielding film was removed using a dry etching device. Chlorine, oxygen, and helium were used as an etching gas, and the gas pressure was set to mTorr, the ICP power was set to 500 W, and the bias power was set to 10 W. The over etching was performed by 200%. At this time, no damage occurred in the lower-layer phase shift film and quartz substrate.

Thus, a phase shift mask according to Example 4 was obtained.

Next, when the phase shift mask was measured for the dose amount at which the haze was generated by accelerated exposure, the dose amount was 110 kJ/$cm^2$.

It was confirmed from the results above that the phase shift mask of Example 4 can reduce the generation of the haze because the dose amount is 110 kJ/$cm^2$.

Comparative Example 1

A phase layer containing silicon, molybdenum, oxygen, and nitrogen was formed with a thickness of 70 nm using a DC sputtering device using two targets on a quartz substrate. Molybdenum and silicon were used as the targets, and argon, oxygen, and nitrogen were used as a sputtering gas. When the composition of the phase layer was analyzed by ESCA, the composition was Si:Mo:O:N=40:8:7:45 (at % ratio).

On the phase layer, a light shielding film containing chromium, oxygen, and nitrogen was formed with a thickness of 50 nm using a DC sputtering device. Chromium was used as the target, and argon, oxygen, and nitrogen were used as a sputtering gas. When the composition of the light shielding film was analyzed by ESCA, the composition was Cr:O:N=55:35:10 (at % ratio).

Next, a negative type chemically amplified electron beam resist was spin-coated on the light shielding film with a film thickness of 200 nm, a pattern was written by an electron beam with a dose amount of 35 μC/$cm^2$, heat treatment was performed at 110° C. for 10 minutes, and development was performed for 90 seconds by paddle development, thereby forming a resist pattern.

Next, the light shielding film was patterned using a dry etching device. Chlorine, oxygen, and helium were used as an etching gas, the gas pressure was set to 5 mTorr, the ICP power was set to 400 W, and the bias power was set to 40 W. The over etching was performed by 100%.

Next, the phase shift film containing only the phase layer was patterned using a dry etching device. $CF_4$ and oxygen were used as an etching gas, and the gas pressure was set to 5 mTorr, the ICP power was set to 400 W, and the bias power was set to 40 W. The dry etching was stopped when the quartz substrate was etched by an average of 3 nm.

Next, the resist pattern was stripped and cleaned by sulfuric acid-hydrogen peroxide mixture cleaning.

Next, the light shielding film was removed using a dry etching device. Chlorine, oxygen, and helium were used as an etching gas, and the gas pressure was set to mTorr, the ICP power was set to 500 W, and the bias power was set to 10 W. The over etching was performed by 200%. At this time, no damage occurred in the lower-layer phase shift film and quartz substrate.

Thus, a phase shift mask according to Comparative Example 1 was obtained.

More specifically, the phase shift mask according to Comparative Example 1 is a phase shift mask not including the protective layers formed in Examples 1 to 4.

Next, when the phase shift mask was measured for the dose amount at which the haze was generated by accelerated exposure, the dose amount was 58 $kJ/cm^2$.

It was confirmed from the results above that the phase shift mask of Comparative Example 1 cannot sufficiently reduce the generation of the haze because the dose amount is 58 $kJ/cm^2$.

As described above, the formation of the protective layer on the phase layer is effective in reducing the generation amount of the haze in the phase shift mask.

As described above, the above-described embodiment describes the phase shift mask blank and the phase shift mask produced using the same of the present invention with reference to Examples, but Examples above are merely examples for implementing the present invention, and the present invention is not limited thereto. Further, it is obvious from the description above that modifications of Examples above are within the scope of the present invention and that various other Examples are possible within the scope of the present invention.

INDUSTRIAL APPLICABILITY

In the present invention, the composition, the film thickness, and the layer structure of the phase shift mask blank, the steps and conditions of manufacturing the phase shift mask using the same are selected within an appropriate range. Therefore, the present invention can provide a phase shift mask having a fine pattern formed with high accuracy compatible with the manufacture of logic devices of 28 nm or less or memory devices of 30 nm or less.

REFERENCE SIGNS LIST

10 phase shift mask blank
11 substrate transparent to exposure wavelength (substrate)
12 phase layer (phase difference and transmittance adjustment layer)
13 protective layer (protective layer against gas permeation)
14 phase shift film
15 light shielding film
16 resist pattern
17 phase shift film pattern
100 phase shift mask
d1 film thickness of phase layer
d2 film thickness of protective layer

The invention claimed is:

1. A phase shift mask blank used for producing a phase shift mask to which an exposure light with a wavelength of 200 nm or less is applied, the phase shift mask blank comprising:

a transparent substrate; and a phase shift film formed on the transparent substrate; wherein the phase shift film includes: a phase difference and transmittance adjustment layer capable of adjusting each of a phase and transmittance by a predetermined amount with respect to a transmitting exposure light; and a protective layer against gas permeation formed on the phase difference and transmittance adjustment layer and preventing gas permeation into the phase difference and transmittance adjustment layer, the phase difference and transmittance adjustment layer is located on the transparent substrate side, and when a film thickness of the phase difference and transmittance adjustment layer is defined as d1 and a film thickness of the protective layer against gas permeation is defined as d2, d1 is larger than d2, and d2 is 15 nm or less, wherein the phase difference and transmittance adjustment layer includes silicon, transition metal, nitrogen, carbon, and oxygen, the transition metal is at least one selected from molybdenum, titanium, vanadium, cobalt, nickel, zirconium, niobium, and hafnium, the protective layer comprises at least one of tantalum, tungsten, tellurium, a tantalum compound, a tungsten compound, or a tellurium compound, the protective layer is configured to prevent transmission of oxidizing gases to the phase difference and transmittance adjustment layer during exposure with the exposure light, the tantalum compound includes tantalum and at least one selected from oxygen, nitrogen, and carbon, the tungsten compound includes tungsten and at least one selected from oxygen, nitrogen, and carbon, and the tellurium compound includes tellurium and at least one selected from oxygen, nitrogen, and carbon.

2. The phase shift mask blank according to claim 1, wherein the phase shift film has resistance to oxygen-containing chlorine-based etching (Cl/O base) and can be etched by fluorine-based etching (F base).

3. A method for manufacturing a phase shift mask using the phase shift mask blank according to claim 1, the method comprising:

forming a light shielding film on the phase shift film;

forming a resist pattern on the light shielding film formed on the phase shift film;

after forming the resist pattern, forming a pattern on the light shielding film by oxygen-containing chlorine-based etching (Cl/O base);

after forming the pattern on the light shielding film, forming a pattern on the phase shift film by fluorine-based etching (F base);

after forming the pattern on the phase shift film, removing the resist pattern; and after removing the resist pattern, removing the light shielding film by oxygen-containing chlorine-based etching (Cl/O base) from the phase shift film.

4. A phase shift mask to which an exposure light with a wavelength of 200 nm or less is applied and which includes a circuit pattern, the phase shift mask comprising:

a transparent substrate; and a phase shift film formed on the transparent substrate; wherein the phase shift film includes: a phase difference and transmittance adjustment layer capable of adjusting each of a phase and transmittance by a predetermined amount with respect to a transmitting exposure light; and a protective layer against gas permeation formed on the phase difference and transmittance adjustment layer and preventing gas permeation into the phase difference and transmittance adjustment layer, the phase difference and transmittance adjustment layer is located on the transparent substrate side, and when a film thickness of the phase difference and transmittance adjustment layer is defined as d1 and a film thickness of the protective layer against gas permeation is defined as d2, d1 is larger than d2, and d2 is 15 nm or less, wherein the phase difference and transmittance adjustment layer includes silicon, transition metal, nitrogen, carbon, and oxygen, and the transition metal is at least one selected from molybdenum, titanium, vanadium, cobalt, nickel, zirconium, niobium, and hafnium, the protective layer comprises at least one of tantalum, tungsten, tellurium, a tantalum compound, a tungsten compound, or a tellurium compound, the protective layer is configured to prevent transmission of oxidizing gases to the phase difference and transmittance adjustment layer during exposure with the exposure light, the tantalum compound includes tantalum and at least one selected from oxygen, nitrogen, and carbon, the tungsten compound includes tungsten and at least one selected from oxygen, nitrogen, and carbon, and the tellurium compound includes tellurium and at least one selected from oxygen, nitrogen, and carbon.

5. The phase shift mask according to claim 4, wherein the phase shift film has resistance to oxygen-containing chlorine-based etching (Cl/O base) and can be etched by fluorine-based etching (F base).

* * * * *